(12) United States Patent
Patel et al.

(10) Patent No.: US 10,373,556 B1
(45) Date of Patent: Aug. 6, 2019

(54) ORGANIC LIGHT EMITTING DIODE DISPLAY DEVICE INCLUDING SEGMENTED POWER LINES

(71) Applicant: Facebook Technologies, LLC, Menlo Park, CA (US)

(72) Inventors: Nirav Rajendra Patel, San Francisco, CA (US); Evan M. Richards, Santa Clara, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 107 days.

(21) Appl. No.: 15/599,055

(22) Filed: May 18, 2017

Related U.S. Application Data

(60) Provisional application No. 62/338,378, filed on May 18, 2016.

(51) Int. Cl.
*H01L 27/32* (2006.01)
*G09G 3/3233* (2016.01)

(52) U.S. Cl.
CPC ....... *G09G 3/3233* (2013.01); *H01L 27/3276* (2013.01); *G09G 2310/08* (2013.01); *G09G 2330/028* (2013.01)

(58) Field of Classification Search
None
See application file for complete search history.

(56) References Cited

U.S. PATENT DOCUMENTS

2004/0257353 A1* 12/2004 Imamura .............. G09G 3/3233
  345/204
2012/0293496 A1* 11/2012 Park ...................... G09G 3/003
  345/419

\* cited by examiner

*Primary Examiner* — Gustavo Polo
(74) *Attorney, Agent, or Firm* — Fenwick & West LLP

(57) ABSTRACT

A display device comprises a display panel having a plurality of pixels for emitting light disposed on an active area of the display panel. The pixels may be grouped into a plurality of subsets, each subset of pixels coupled to a corresponding power line. The subsets of pixels may be programmed and operated in succession in a rolling configuration. The power line may be configured to provide a low supply voltage to turn on the corresponding subset of pixels, or a high supply voltage to turn off the corresponding subset of pixels. By turning off each subset of pixels when the subset is not being programmed or controlled to emit light, a picture quality of the display may potentially be improved, by preventing leakages or tailing effects in the non-emitting pixels when of the display.

12 Claims, 3 Drawing Sheets

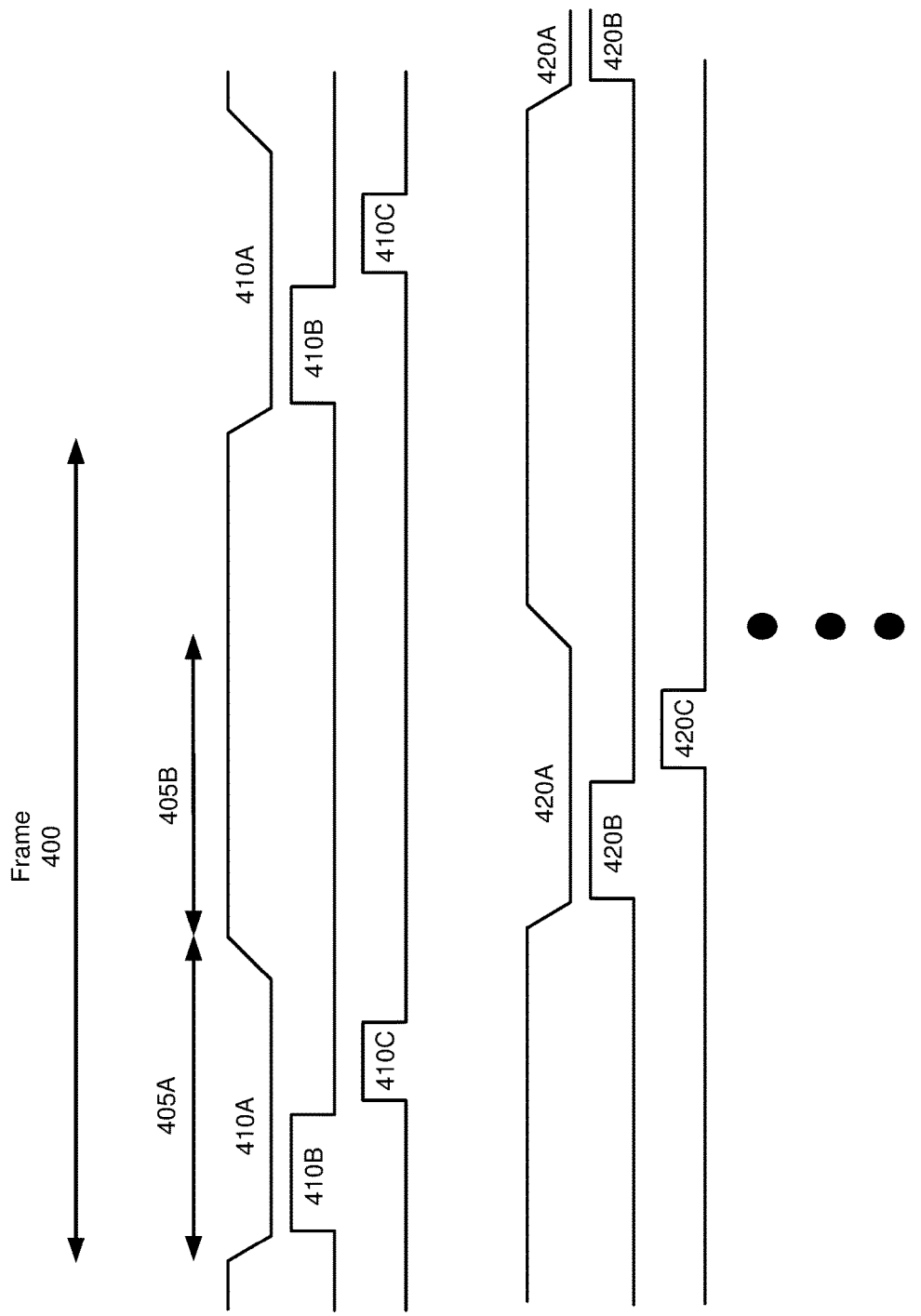

ORGANIC LIGHT EMITTING DIODE DISPLAY DEVICE INCLUDING SEGMENTED POWER LINES

CROSS-REFERENCE TO RELATED APPLICATION

The present disclosure claims priority to U.S. Provisional Patent Application No. 62/338,378, titled "Organic Light Emitting Diode Display Device Including Segmented Power Lines," filed on May 18, 2016, which is hereby incorporated by reference in its entirety.

BACKGROUND

The present disclosure generally relates to an organic light emitting diode (OLED) display device.

A display of the display device may comprise an array of OLED pixels. In some implementations, the OLED pixels may be controlled in a rolling configuration. For example, the OLED pixels may be divided into a plurality of groups. The groups of OLED pixels may be programmed and emit light in succession.

SUMMARY

A display device comprises a display panel having a plurality of pixels for emitting light disposed on an active area of the display panel. The pixels may be grouped into a plurality of subsets, each subset of pixels coupled to a corresponding power line. The subsets of pixels may be programmed and operated in succession in a rolling configuration.

Each power line is coupled to a corresponding switching circuit configured to provide power to the corresponding subset of pixels at different power levels, including a low supply voltage level to turn on the corresponding subset of pixels, or a high supply voltage level to turn off the corresponding subset of pixels. By turning off each subset of pixels when the subset is not being programmed or controlled to emit light, a picture quality of the display may potentially be improved, by preventing leakages or tailing effects in the non-emitting pixels of the display.

BRIEF DESCRIPTION OF THE DRAWINGS

FIG. 4 illustrates a timing diagram of operating an OLED display device, in accordance with an embodiment.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Configuration Overview

Example embodiments of disclosed configurations include an OLED display device having separate power lines and switches coupled to corresponding power lines for independently powering OLEDs.

In one or more embodiments, the disclosed OLED display includes a plurality of OLEDs connected to power lines. A power line is a conductive component through which a voltage (e.g., ELVSS) can be applied to an electrode (e.g., cathode or anode) of an OLED. The OLEDs can be divided into a number of groups, where OLEDs in different groups are connected to separate power lines. For example, pixels in a first row are coupled to a first power line, and pixels in a second row are coupled to a second power line. Accordingly, a voltage (e.g., ELVSS) can be provided to groups of pixels at different time periods.

System Overview

Figure 1:
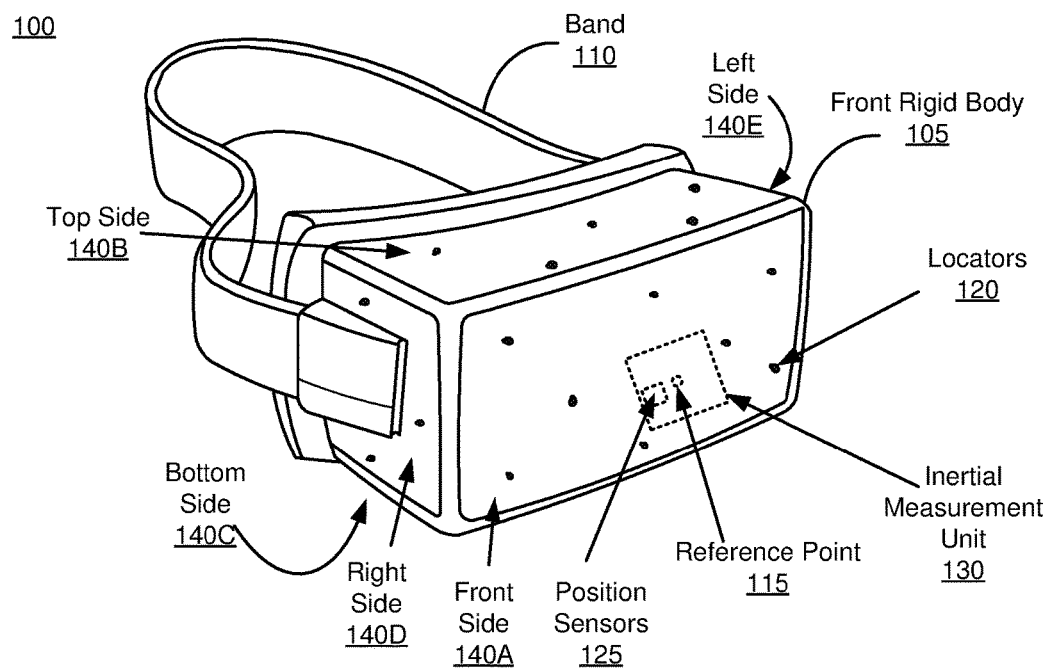
FIG. 1 is a diagram of a headset, in accordance with an embodiment.

FIG. 1 is a diagram of a headset 100, in accordance with an embodiment. In one embodiment, the headset 100 includes a front rigid body 105 and a band 110. The front rigid body 105 includes an electronic display (not shown), an inertial measurement unit (IMU) 130, one or more position sensors 125, and locators 120. In one embodiment, a user movement is detected by use of the inertial measurement unit 130, position sensors 125, and/or the locators 120, and an image is presented to a user through the electronic display according to the user movement detected. In one embodiment, the headset 100 can be used for presenting a virtual reality, an augmented reality, or a mixed reality to a user.

A position sensor 125 generates one or more measurement signals in response to motion of the headset 100. Examples of position sensors 125 include: one or more accelerometers, one or more gyroscopes, one or more magnetometers, another suitable type of sensor that detects motion, a type of sensor used for error correction of the IMU 130, or some combination thereof. The position sensors 125 may be located external to the IMU 130, internal to the IMU 130, or some combination thereof. In the embodiment shown by FIG. 1, the position sensors 125 are located within the IMU 130, and neither the IMU 130 nor the position sensors 125 are visible to the user.

Based on the one or more measurement signals from one or more position sensors 125, the IMU 130 generates calibration data indicating an estimated position of the headset 100 relative to an initial position of the headset 100. In some embodiments, the IMU 130 rapidly samples the measurement signals and calculates the estimated position of the headset 100 from the sampled data. For example, the IMU 130 integrates the measurement signals received from the accelerometers over time to estimate a velocity vector and integrates the velocity vector over time to determine an estimated position of a reference point on the headset 100. Alternatively, the IMU 130 provides the sampled measurement signals to a console (e.g., a computer), which determines the calibration data. The reference point is a point that may be used to describe the position of the headset 100. While the reference point may generally be defined as a point in space; however, in practice the reference point is defined as a point within the headset 100 (e.g., a center of the IMU 130).

The locators 120 are located in fixed positions on the front rigid body 105 relative to one another and relative to a reference point 115. In the example of FIG. 1, the reference point 115 is located at the center of the IMU 130. Each of the locators 120 emits light that is detectable by an imaging device (e.g., camera or an image sensor). Locators 120, or portions of locators 120, are located on a front side 140A, a top side 140B, a bottom side 140C, a right side 140D, and a left side 140E of the front rigid body 105 in the example of FIG. 1.

Figure 2:
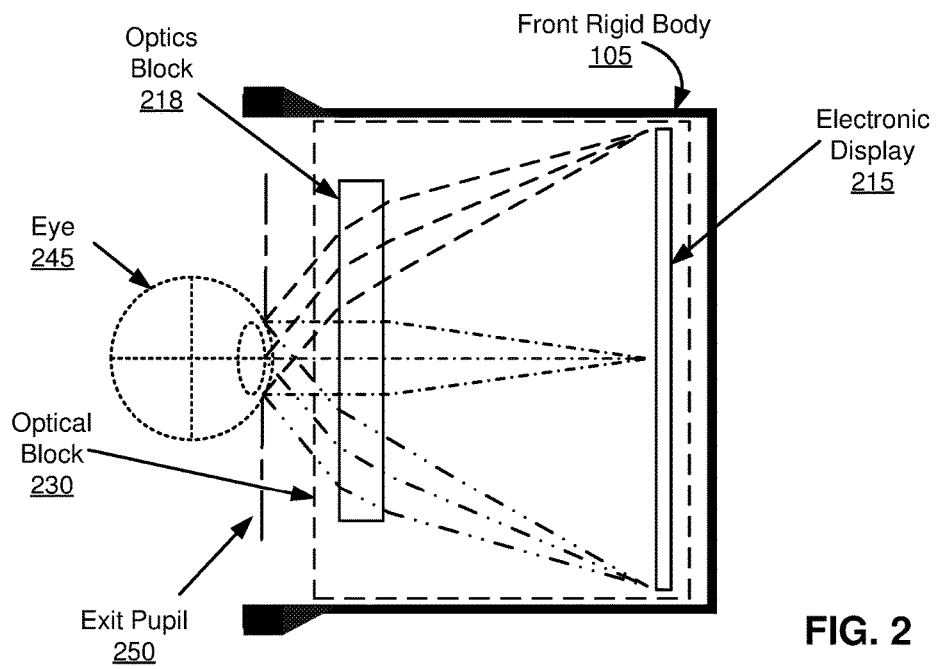
FIG. 2 is a cross section of a front rigid body of the headset in FIG. 1, in accordance with an embodiment.

FIG. 2 is a cross section 225 of the front rigid body 105 of the embodiment of the headset 100 shown in FIG. 1. As shown in FIG. 2, the front rigid body 105 includes an optical block 230 that provides altered image light to an exit pupil 250. The exit pupil 250 is the location of the front rigid body 105 where a user's eye 245 is positioned. For purposes of illustration, FIG. 2 shows a cross section 225 associated with a single eye 245, but another optical block, separate from the optical block 230, provides altered image light to another eye of the user.

The optical block 230 includes an electronic display 215, and the optics block 218. The electronic display 215 emits image light toward the optics block 218. The optics block 218 magnifies the image light, and in some embodiments, also corrects for one or more additional optical errors (e.g., distortion, astigmatism, etc.). The optics block 218 directs the image light to the exit pupil 250 for presentation to the user. In one or more embodiments, the optics block 218 may be omitted.

Figure 3:
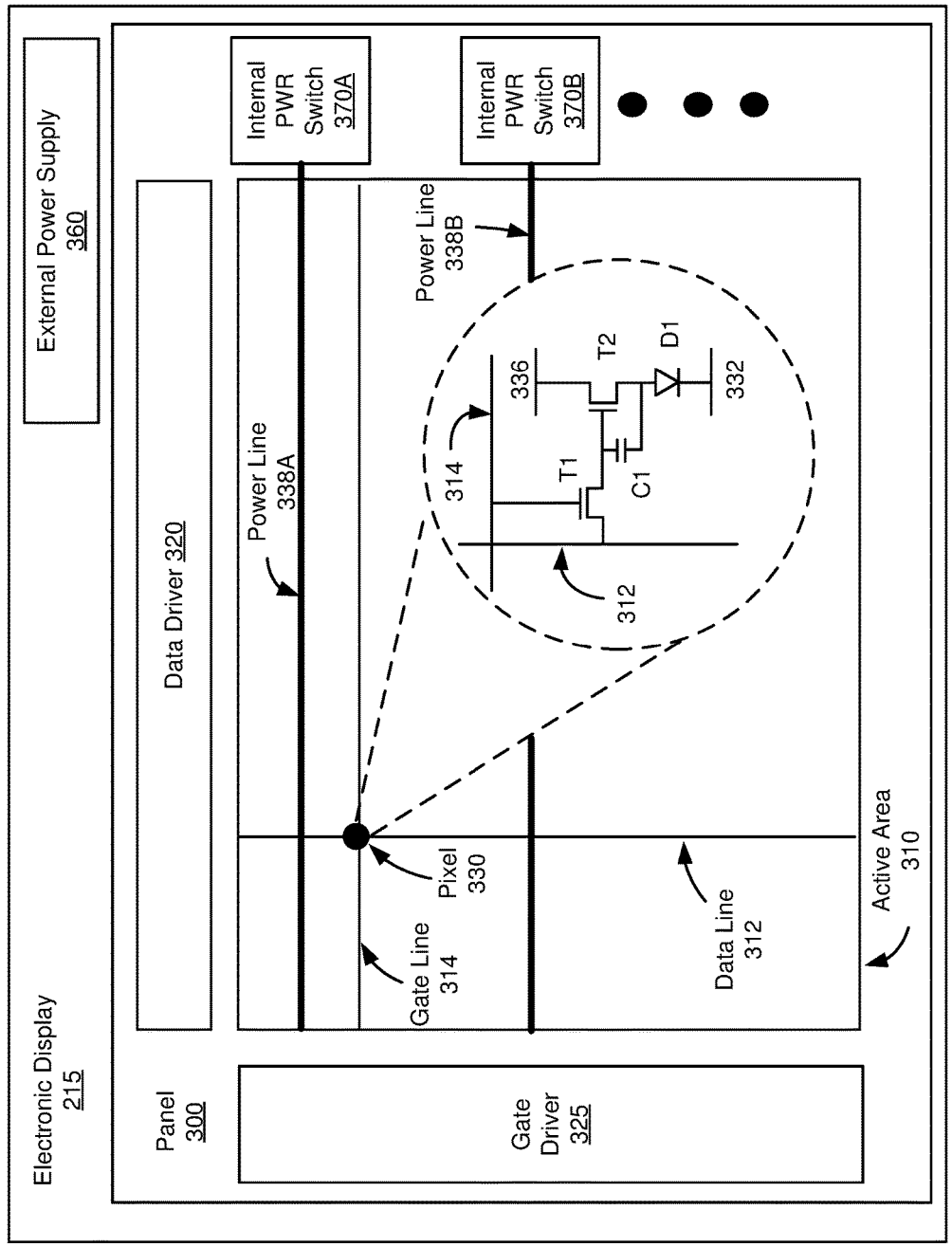
FIG. 3 is a detailed diagram of an electronic display including segmented power lines, in accordance with an embodiment.

FIG. 3 is a detailed diagram of an electronic display 215. The electronic display 215 includes a panel 300, and an external power supply 360 physically separated from the panel 300. The external power supply 360 may be coupled to the panel 300 through one or more cables. The panel 300 includes an active area 310, a data driver 320, a gate driver 325, and internal power switches 370. These components can be integrated together, for example as a gate in panel structure.

The active area 310 is a portion of the panel 300 that displays an image. The active area 310 of the panel 300 includes gate lines 314, data lines 312 and pixels 330. Each pixel 330 is formed at an intersection of a gate line 314 and a data line 312. Each pixel emits light according to signals applied through its corresponding gate line 314 and data line 312.

In the example shown in FIG. 3, each pixel 330 has a 2T1C structure including a first transistor T1, a second transistor T2, a capacitor C1, and an OLED D1. Specifically, a first electrode (e.g., drain or source) of the first transistor T1 is coupled to a data line 312, and a second electrode of the first transistor T1 is coupled to a gate electrode of the second transistor T2. A gate electrode of the first transistor T1 is coupled to a gate line 314. In addition, a first electrode (e.g., source or drain) of the second transistor T2 is coupled to a first electrode (e.g., anode) of the OLED D1, and a second electrode (e.g., drain or source) of the second transistor T2 is coupled to a first power terminal 336. A second electrode (e.g., cathode) of the OLED D1 is coupled to a second power terminal 332. In addition, the capacitor C1 is coupled between the gate electrode and the first electrode of the second transistor T2. In this configuration, amount of charges corresponding to a data voltage applied from the data driver 320 through the data line 312 are stored at the capacitor C1, according to a gate control signal applied from the gate driver 325 through the gate line 314. According to the amount of charges stored in the capacitor C1, a corresponding amount of current flows through the second transistor T2 through the OLED D1 to emit light. The pixel structure shown in FIG. 3 is merely an example, and in other embodiments, the pixel 330 can be implemented in a different configuration than shown in FIG. 3.

In one or more embodiments, voltages supplied to the first power terminal 336 and the second power terminal 332 are controlled for displaying an image. For example, a high supply voltage (ELVDD) is applied to the first power terminal 336, and a low supply voltage (ELVSS) lower than the high supply voltage is applied to the second power terminal 332, when the pixel is programmed (i.e., a charge is stored at the capacitor C1) during a programming period and/or when the pixel emits light during an emission period. When the pixel is neither being programmed nor emitting light, for example, during a non-emission period, a high supply voltage (ELVDD) instead of the low supply voltage (ELVSS) may be applied to the second power terminal 332 to turn off the OLED D1.

The external power supply 360 generates the low supply voltage ELVSS, and provides the low supply voltage ELVSS to the panel 300 through a conductive pin of a cable. The external power supply 360 can also generate the high supply voltage ELVDD, and provide the high supply voltage ELVDD to the panel 300 through another conductive pin of the cable or another cable. In some embodiments, the external power supply 360 outputs the low supply voltage ELVSS or the high supply voltage ELVDD through the same conductive pin of the cable, depending on an operation of the panel. For example, the external power supply 360 outputs the low supply voltage ELVSS at a first time period (e.g., during the programming and the emission period), and outputs the high supply voltage ELVDD through the same conductive pin of the cable at a second time period (e.g., non-emission period). Accordingly, the external power supply 360 can enable or disable the low supply voltage ELVSS from being supplied to the second power terminal 332.

The internal power switch 370 is an electronic component that controls a voltage applied to the second power terminal 332. For example, the internal power switch 370 receives the low supply voltage ELVSS and the high supply voltage ELVDD from the external power supply 360, and provides either the low supply voltage ELVSS or the high supply voltage ELVDD to the second power terminal 332 through a power line 338. Depending on the voltage supplied to the second power terminal 332, light can be emitted or prevented from being emitted from the OLED D1. In some embodiments, the internal power switch 370 sequential provides the low supply voltage ELVSS (or the high supply voltage ELVDD) to a group of pixels (e.g., pixels in one or more rows).

In one embodiment, pixels 330 in the active area 310 are divided into groups, and the internal power switches 370 supply the low supply voltage ELVSS to pixels in different groups at different times. Specifically, second power terminals 332 of pixels 330 in a group (e.g., pixels in a row) are coupled to a single power line 338A, where second power terminals 332 of pixels in another group (e.g., pixels in another row) are coupled to a single power line 338B. Hence, the internal power switch 370A coupled to the power line 338A can provide the low supply voltage ELVSS to pixels coupled to the power line 338A, and the internal power switch 370B coupled to the power line 338B can provide the low supply voltage ELVSS to pixels coupled to the power line 338B at different time periods. Although two internal power switches 370 are shown in FIG. 3, in other embodiments, any number of internal power switches 370 can be implemented. Moreover, any number of power lines 338 can be implemented in other embodiments. In some embodiments, pixels 330 in two or more rows as a group can be coupled to a single power line 338.

In some embodiments, the internal power switch 370 may be omitted, and the external power supply 360 may be switched to provide either the high supply voltage ELVDD or the low supply voltage ELVSS at a different time period to entire pixels 330 in the panel 300 (e.g., the second power terminal 332). However, providing different voltages from the external power supply 360 may require a settling time to charge or discharge the panel 300, and pixels in different groups may be programmed differently because of the settling time. For example, capacitors of pixels programmed towards an end of a frame (e.g., pixels in a last row) may be charged or discharged at different voltage levels than pixels in preceding rows, thus an image presented through the pixels towards the end of the frame may be degraded.

By implementing segmented power lines 338 and implementing a plurality of internal power switches 370, each of which is coupled to a corresponding power line 338 for providing the low supply voltage ELVSS to pixels 330 coupled to the corresponding power line 338, timing of providing the low supply voltage ELVSS to the second power terminals 332 of the pixels 330 can be individually controlled for each group to avoid errors introduced in programming due to the settling time of the external power supply 360.

In some embodiments, a group of pixels in different rows are tied to a power line 338A, and another group of pixels in different rows are tied to another power line 338B. For example, pixels in rows 1 through n may be coupled to the power line 338A, and pixels in rows n+1 to 2n are coupled to the power line 338B. In addition, each power line 338 would then be connected to a corresponding external switch to the panel 300, thus internal power switches 370 may be omitted. The external switch may be coupled to the external power supply 360 that would enable or disable the low supply voltage ELVSS to be supplied to pixels in each group of rows. This would eliminate the need for the internal power switches 370 on the panel 300 and achieve a similar effect.

FIG. 4 illustrates a timing diagram of operating the electronic display 215, in accordance with an embodiment. Within a time frame 400, pulses 410A, 410B, 410C are applied to pixels in a first group (e.g., a first row) during a first time period 405A, and pulses 420A, 420B, 420C are applied to pixels in a second group (e.g., a second row) during a second time period 405B.

In detail, the pulse 410A represents a low supply voltage ELVSS applied to the first power line 338A during the first time period 405A. The pulse 410B in the first time period 405A represents a data voltage applied to data lines 312 for programming the pixels coupled to the first power line 338A. The subsequent pulse 410C in the first time period 405A represents an emission control signal applied to the gate line 314 to enable emission of light. In one example, the pulse 410A starts earlier than the pulse 410B to ensure sufficient charging time of the external power supply 360. For the remaining time in the time frame 400 after the pulse 410C, the high supply voltage ELVDD instead of the low supply voltage ELVSS can be applied to the first power line 338A to turn off the OLEDs coupled to the first power line 338A to remove tailing effects, for example, due to leakage through the internal power switch 370, that may occur if the OLEDs coupled to the first power line 338A were continued to be supplied with the low supply voltage ELVSS outside the first time period 405A.

The pulses 420A, 420B, 420C are asserted during the second time period 405B different from the first time period 405A. The pulses 420A, 420B, 420C are identical to the pulses 410A, 410B, 410C asserted during the first time period, respectively, except the pulse 420A is applied to a second power line 338B, and the pulses 420B, 420C are applied to pixels coupled to the second power line 338B. Therefore, the detailed description thereof is omitted herein for the sake of brevity.

Accordingly, each row can have data, emission, and charging times specified by the required application.

Additional Configuration Information

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A display device, comprising:
  a display panel including:
    a plurality of pixel circuits disposed on an active area of the display panel for emitting light,
    at least two lines including a first line and a second line disposed on the active area, the first line coupled to a first group of pixel circuits of the plurality of pixel circuits, the second line coupled to a second group of pixel circuits of the plurality of pixel circuits, and
    a first switching circuit, the first switching circuit coupled to the first line, and configured to:
      (i) in a first state, supply power at a first power level to the first group of pixel circuits coupled to the first line, and
      (ii) in a second state, supply power at a second power level to the first group of pixel circuits coupled to the first line; and
    a second switching circuit, the second switching circuit coupled to the second line, and configured to:
      (i) in the first state, supply power at the first power level to the second group of pixel circuits coupled to the second line, and
      (ii) in the second state, supply power at the second power level to the second group of pixel circuits coupled to the second line; and
    wherein a pixel circuit of the plurality of pixel circuits is configured to receive at least a first pulse along a data line to program a value for the pixel circuit, and a second pulse corresponding to an emission control signal to enable the pixel circuit to emit light based upon the programmed value, wherein the first and second pulses are received during a time period when the corresponding switching circuit is operating in the first state.

2. The display device of claim 1, wherein the first switching circuit is configured to operate in the second state while the second switching circuit operates in the first state.

3. The display device of claim 1, wherein the first power level is lower than the second power level.

4. The display device of claim 1, wherein each group of pixel circuits is configured to emit light during at least a portion of when the corresponding switching circuit is operating in the first state, and to emit no light when the corresponding switching circuit is operating in the second state.

5. The display device of claim 1, wherein each of the plurality of pixel circuits comprises a first power terminal and a second power terminal, and wherein each of the at least two lines are coupled to the second power terminals of each of the corresponding group of pixel circuits.

6. The display device of claim 5, wherein the first power terminal of each of the pixel circuits is configured to receive power at the second power level during the first and second states.

7. A display device, comprising:
a display panel including:
a plurality of pixels disposed on an active area of the display panel for emitting light,
a plurality of lines disposed on the active area, each line of the plurality of lines coupled to a corresponding subset of pixels of the plurality of pixels, and
a plurality of switching circuits, each switching circuit coupled to a corresponding line of the plurality of lines and the corresponding subset of pixels coupled to the corresponding line, each of the plurality of switching circuits individually controlled to selectively provide power to the corresponding subset of pixels at a first power level or at a second power level;
wherein a pixel of the plurality of pixels is configured to receive at least a first pulse along a data line to program a value for the pixel, and a second pulse corresponding to an emission control signal to enable the pixel to emit light based upon the programmed value, wherein the first and second pulses are received during a time period when the corresponding switching circuit is controlled to provide power at the first power level.

8. The display device of claim 7, wherein when a first switching circuit of the plurality of switching circuits is controlled to provide power to its corresponding line at the first power level, the remaining switching circuits of the plurality switching circuit are controlled to provide power to the corresponding lines at the second power level.

9. The display device of claim 7, wherein the first power level is lower than the second power level.

10. The display device of claim 7, wherein each subset of pixels is configured to emit light during at least a portion of when the corresponding switching circuit is controlled to provided power at the first power level, and to emit no light when the corresponding switching circuit is controlled to provide power at the second power level.

11. The display device of claim 7, wherein each of the plurality of pixels comprises a first power terminal and a second power terminal, and wherein each of the plurality of lines are coupled to the second power terminals of each of the corresponding subset of pixels.

12. The display device of claim 11, wherein the first power terminal of each of the pixels is configured to receive power at the second power level.

* * * * *